(12) United States Patent
Niu et al.

(10) Patent No.: US 9,313,915 B2
(45) Date of Patent: Apr. 12, 2016

(54) ELECTRONIC DEVICE

(71) Applicant: ASUSTeK COMPUTER INC., Taipei (TW)

(72) Inventors: Chia-Ching Niu, Taipei (TW); Ing-Jer Chiou, Taipei (TW); Cheng-Yu Wang, Taipei (TW)

(73) Assignee: ASUSTEK COMPANY INC., Taipei (TW)

( * ) Notice: Subject to any disclaimer, the term of this patent is extended or adjusted under 35 U.S.C. 154(b) by 203 days.

(21) Appl. No.: 14/072,758

(22) Filed: Nov. 5, 2013

(65) Prior Publication Data

US 2014/0146472 A1 May 29, 2014

(30) Foreign Application Priority Data

Nov. 27, 2012 (CN) .......................... 2012 1 0491297

(51) Int. Cl.
| | | |
|---|---|---|
| H02B 1/00 | (2006.01) | |
| H02B 1/56 | (2006.01) | |
| H05K 7/20 | (2006.01) | |
| H05K 1/00 | (2006.01) | |
| H01R 13/46 | (2006.01) | |
| H05K 5/00 | (2006.01) | |
| H01L 23/34 | (2006.01) | |
| F28F 7/00 | (2006.01) | |
| F28D 15/00 | (2006.01) | |
| G06F 1/20 | (2006.01) | |
| F28D 15/02 | (2006.01) | |
| F04D 29/40 | (2006.01) | |

(52) U.S. Cl.
CPC .. *H05K 7/20* (2013.01); *G06F 1/20* (2013.01); *G06F 1/203* (2013.01); *H05K 7/20145* (2013.01); *H05K 7/20445* (2013.01); *F04D 29/40* (2013.01); *F28D 15/02* (2013.01)

(58) Field of Classification Search
CPC ............. H05K 7/20; G06F 1/20; F28D 15/02; F04D 1/00; F04D 29/40
USPC ......... 361/76–678, 679.46–679.54, 688–723, 361/831; 174/526, 252, 520; 165/104.33, 165/80.3, 80.4
See application file for complete search history.

(56) References Cited

U.S. PATENT DOCUMENTS

| | | | |
|---|---|---|---|
| 6,250,378 B1 | 6/2001 | Kobayashi | |
| 6,262,892 B1 * | 7/2001 | Bhatia | ........................... 361/695 |
| 7,505,274 B2 * | 3/2009 | Yu | ........................ H01L 23/4006 |
| | | | 165/80.3 |
| 2006/0215370 A1 * | 9/2006 | Kuo | ...................... H01L 23/367 |
| | | | 361/707 |
| 2007/0210679 A1 * | 9/2007 | Adducci | ................ H02B 1/202 |
| | | | 312/7.2 |

(Continued)

FOREIGN PATENT DOCUMENTS

| | | |
|---|---|---|
| CN | 2267479 Y | 11/1997 |
| CN | 2653578 Y | 11/2004 |

(Continued)

*Primary Examiner* — Courtney Smith
*Assistant Examiner* — Zhengfu Feng
(74) *Attorney, Agent, or Firm* — CKC & Partners Co., Ltd.

(57) ABSTRACT

An electronic device includes an upper cover, a lower cover combined with the upper cover, and a heat conducting pillar. An accommodating space is formed by the upper cover and the lower cover. The heat conducting pillar is disposed in the accommodating space and physically connected with the upper cover and the lower cover to balance the temperature of the upper cover and the lower cover.

3 Claims, 3 Drawing Sheets

(56) References Cited

U.S. PATENT DOCUMENTS

2009/0021914 A1* 1/2009 Fang et al. .................. 361/702
2012/0069514 A1* 3/2012 Ross ........................ G06F 1/20
　　　　　　　　　　　　　　　　　　　　　　361/679.33

FOREIGN PATENT DOCUMENTS

| CN | 101901036 A | 12/2010 |
| CN | 201812610 U | 4/2011 |

* cited by examiner

ELECTRONIC DEVICE

CROSS-REFERENCE TO RELATED APPLICATION

This application claims the priority benefit of CN application serial NO. 201210491297.7, filed on Nov. 27, 2012. The entirety of the above-mentioned patent application is hereby incorporated via reference herein and made a part of specification.

BACKGROUND OF THE INVENTION

1. Field of the Invention

This disclosure relates to an electronic device and, more particularly to a portable electronic device.

2. Description of the Related Art

A processor of an electronic device can generate heat in operation. While the heat generated by the processor cannot be dissipate, the electronic device may work in unstable state. Thus, the electronic device needs a heat dissipation module to enhance the heat dissipation effect.

With the development of science, more portable electronic devices such as a notebook, a tablet computer or a smartphone are commonly used in daily life. Since the development trend of appearance of portable electronic device is miniaturization in which the inner space of the portable electronic is limited so as to the space used to heat dissipate of the heat dissipation module is limited the same.

BRIEF SUMMARY OF THE INVENTION

An electronic device with a heat conducting pillar is provided to enhance the heat dissipation efficiency.

The electronic device includes an upper cover, a lower cover combined with the upper cover and a heat conducting pillar. An accommodating space is formed by the upper cover and the lower cover. The heat conducting pillar is disposed in the accommodating space and connected to the upper cover and the lower cover to balance the temperatures of the upper cover and the lower cover.

The heat conducting pillar may be a solid structure or a hollow structure. When the heat conducting pillar is a hollow structure, the heat conducting pillar includes a sidewall and a passage formed by the surrounded sidewall. The heat conducting pillar may also include a plurality of holes in the sidewall. The upper cover includes a plurality of ventilation holes, and the passage leads to the cooling hole. The electronic device further includes a fan disposed in the accommodating space, the air outside the electronic device is guided into the electronic device through the passage by the fan, and then the air is exhausted through the holes and flows along the path provided by the fan. In this disclosure, the heat conducting pillar connecting the upper cover and the lower cover balances the temperatures of the upper cover and the lower cover to enhance the heat dissipation efficiency of the electronic device.

DETAILED DESCRIPTION OF THE EMBODIMENTS

Figure 1:
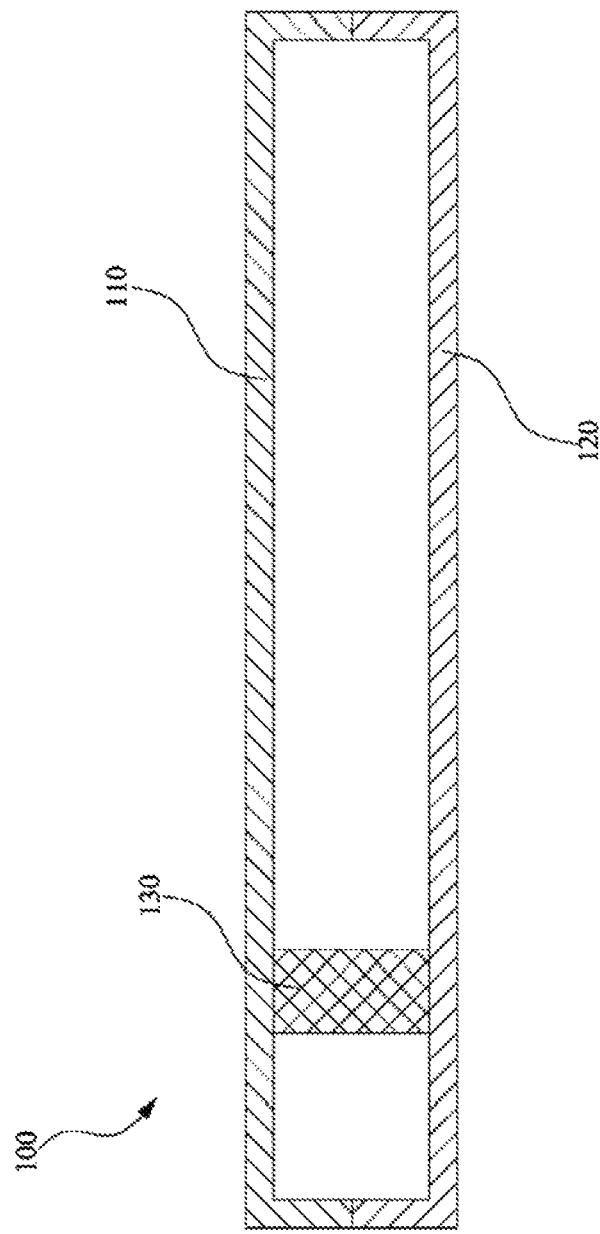
FIG. 1 is a sectional schematic diagram showing an electronic device in one embodiment.

FIG. 1 is a sectional schematic diagram showing an electronic device 100 in one embodiment. The electronic device 100 includes an upper cover 110, a lower cover 120 and a heat conducting pillar 130. The upper cover 110 and the lower cover 120 are combined with each other to form a casing of the electronic device 100, and an accommodating space is formed between the upper cover 110 and the lower cover 120. The heat conducting pillar 130 is disposed in the accommodating space and physically connected with the upper cover 110 and the lower cover 120 to balance the temperature of the upper cover 110 and the lower cover 120.

In the electronic device 100, since the configurations and positions of heat generating elements are various, one of the upper cover 110 and the lower cover 120 usually has a higher temperature. The heat conducting pillar 130 connecting the upper cover 110 and the lower cover 120 conducts the heat from one of the upper cover 110 and the lower cover 120 with higher temperature to another one with lower temperature, it avoids that heat is concentrated in a certain region of the electronic device 100, and the temperature distribution of the casing of the electronic device 100 is balanced.

The material of the heat conducting pillar 130 may be produced by mental of high thermal conductivity coefficient such as copper or aluminum. The shape and the size of the heat conducting pillar 130 are not limited as long as two ends of the heat conducting pillar 130 are connected to the upper cover 110 and the lower cover 120 respectively. In this embodiment, the heat conducting pillar 130 is a solid rectangular pillar, and the heat conducting pillar 130 is a uniform pillar with a same cross-sectional shape. However, the shape and the size of the heat conducting pillar 130 can be changed according to demands such as a cylinder or a prism.

Figure 2:
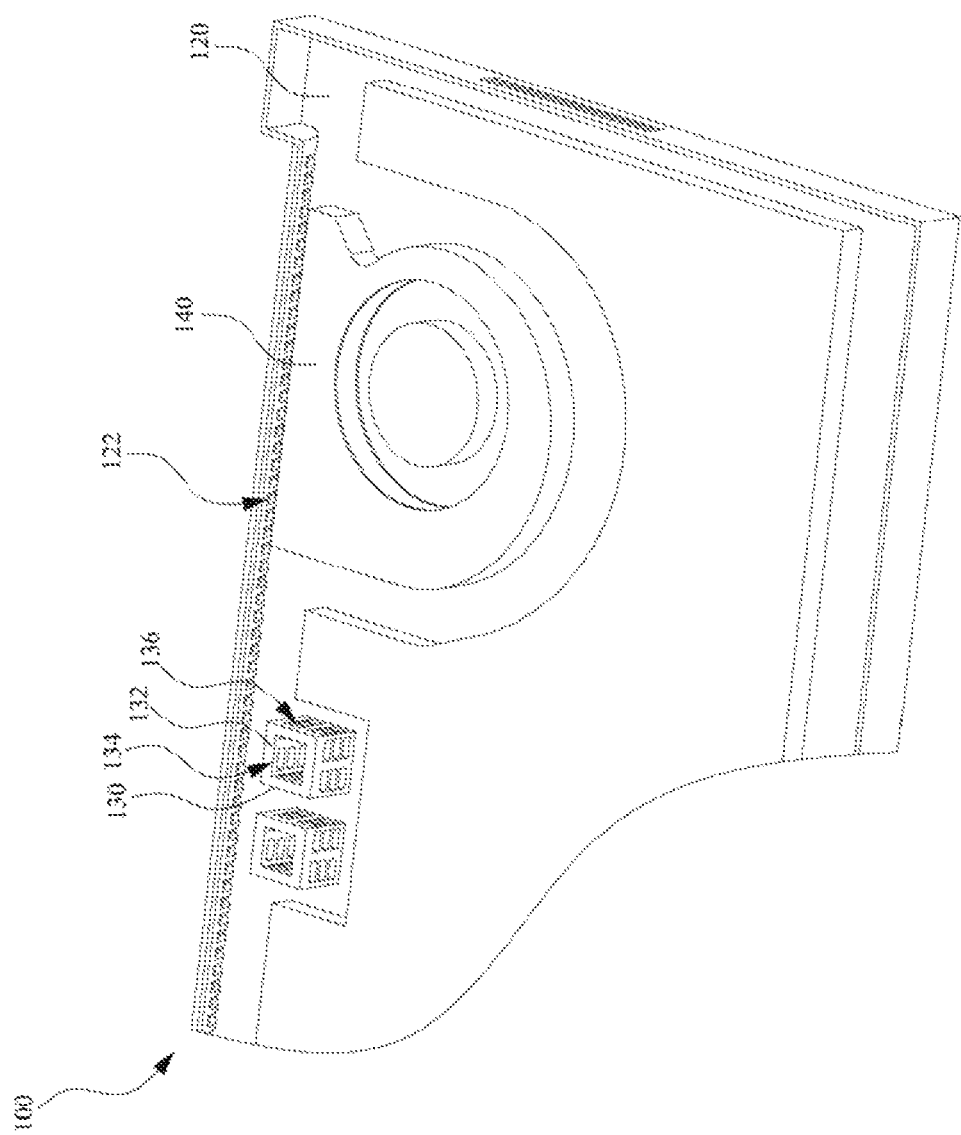
FIG. 2 is partial schematic diagram showing a top view of the electronic device in another embodiment.

FIG. 2 is partial schematic diagram showing a top view of the electronic device in another embodiment. The upper cover is not shown in FIG. 2.

The electronic device 100 further includes a fan 140 which is disposed in the accommodating space. The lower cover 120 includes a plurality of air inlet holes 122 to make the air flow into the electronic device 100 to dissipate heat. In this embodiment, the heat conducting pillar 130 is a hollow structure, and the heat conducting pillar 130 includes a sidewall 132 and a passage 134 formed by the surrounded sidewall 132. The heat conducting pillar 130 further includes a plurality of holes 136 at the sidewall 132. The air is guided by the fan 140 to pass through the passage 134 and the holes 136 to enhance the heat dissipation efficiency of the heat conducting pillar 130.

The fan 140 exhausts the air to form a negative pressure inside the electronic device 100 relative to outside of the electronic device 100, and a preset flowing path is formed. The air with low temperature outside the electronic device 100 is guided into the electronic device 100 through the passage 134 by the negative pressure, and then the air is exhausted through the holes 136 at the sidewall 132 along the preset flowing path provided by the fan 140. The air is exhausted by the fan 140 after having a heat exchange with electronic components in the electronic device 100.

The heat conducting pillar 130 including the passage 134 and the holes 136 can conduct the heat from one of the upper cover 110 and the lower cover 120 with higher temperature to another one with lower temperature to balance the temperature. Moreover, since the heat conducting pillar 130 includes the passage 134 and a plurality of holes 136, the contacting area between the air and the heat conducting pillar 130 is increased, and the heat exchange area between the heat conducting pillar 130 and the air is increased to enhance the heat exchange efficiency of the heat conducting pillar 130.

Figure 3:
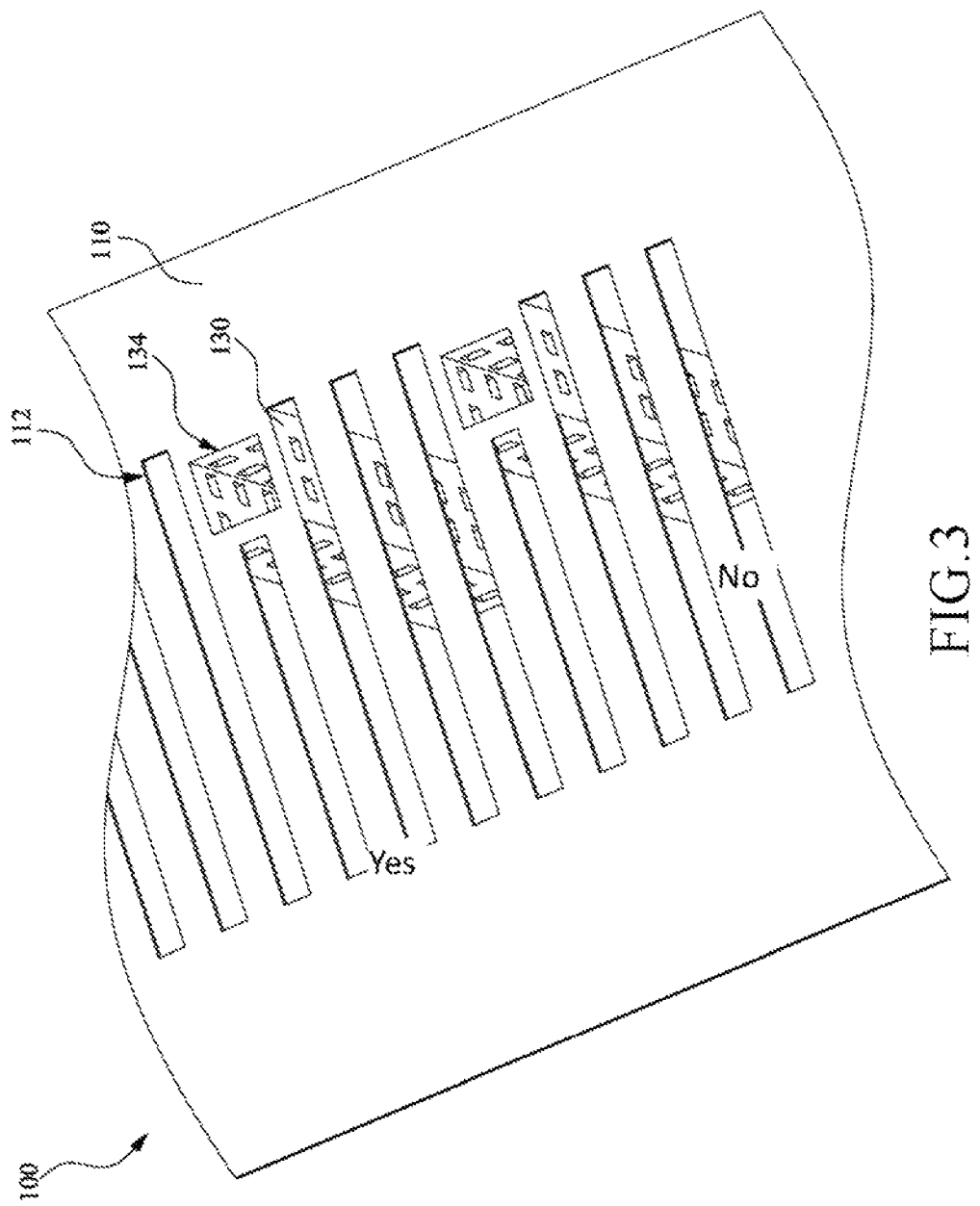
FIG. 3 is partial schematic diagram showing an appearance of the electronic device in FIG. 2.

FIG. 3 is partial schematic diagram showing an appearance of the electronic device in FIG. 2. The upper cover 110 of the electronic device 100 includes a plurality of ventilation holes 112 for the air to enter into the electronic device 100, When the heat conducting pillar 130 is a hollow structure, the heat conducting pillar 130 can be disposed under the ventilation holes 112, the passage 134 of the heat conducting pillar 130 can lead to the ventilation holes 112. The position of the heat conducting pillar 130 is not limited herein as long as it is connected to the upper cove 110 and the lower cover 120.

According to a simulation result, when the heat conducting pillar is disposed in the electronic device, the heat dissipation efficiency of the electronic device is enhanced. Conditions and results are shown in a following table:

|  | central processing unit | graphics card | upper cover | lower cover |
|---|---|---|---|---|
| experimental example 1 | 85.5 | 83.3 | 43.6 | 33.1 |
| experimental example 2 | 85.5 | 83.4 | 38.4 | 33.8 |
| experimental example 3 | 85.5 | 83.4 | 38.8 | 34.6 |

Experimental example 1 show that the electronic device without the heat conducting pillar. The heat conducting pillar in experimental example 2 is a hollow structure with a bottom area of 4 cm multiplies 4 cm; and the heat conducting pillar in experimental example 3 is a solid structure with a bottom area of 4 cm multiplies 4 cm.

In sum up, the heat conducting pillar is connected with the upper cover and the lower cover of the electronic device to balance the temperature of the upper cover and the lower cover, and the heat dissipation efficiency of the electronic device is enhanced.

Although the disclosure has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. An electronic device, comprising:
an upper cover;
a lower cover composed with the upper cover, wherein the upper cover and the lower cover form an accommodating space;
a heat conducting pillar comprising a plurality of holes formed on a sidewall of the heat conducting pillar, and disposed in the accommodating space and connected with the upper cover and the lower cover; and
a fan disposed in the accommodating space to guide air into the accommodating space,
wherein the heat conducting pillar comprises a passage defined by a plurality of the sidewalls, the upper cover comprises a plurality of ventilation holes, and the passage leads to the ventilation holes.

2. The electronic device according to claim 1, wherein the heat conducting pillar is disposed in the flowing path of the air.

3. The electronic device according to claim 1 wherein a plurality of holes forms on the surrounded sidewall.

* * * * *

UNITED STATES PATENT AND TRADEMARK OFFICE
CERTIFICATE OF CORRECTION

PATENT NO. : 9,313,915 B2
APPLICATION NO. : 14/072758
DATED : April 12, 2016
INVENTOR(S) : Chia-Ching Niu et al.

Page 1 of 1

It is certified that error appears in the above-identified patent and that said Letters Patent is hereby corrected as shown below:

Title Page item 73 the name of Assignee should read as "ASUSTeK COMPUTER INC." rather than "ASUSTeK COMPANY INC.".

Signed and Sealed this
Fifth Day of July, 2016

Michelle K. Lee
*Director of the United States Patent and Trademark Office*